US010804878B2

(12) United States Patent
Lee et al.

(10) Patent No.: US 10,804,878 B2
(45) Date of Patent: Oct. 13, 2020

(54) ACOUSTIC RESONATOR MODULE AND METHOD OF MANUFACTURING THE SAME

(71) Applicant: SAMSUNG ELECTRO-MECHANICS CO., LTD., Suwon-si (KR)

(72) Inventors: June Kyoo Lee, Suwon-si (KR); Chul Soo Kim, Suwon-si (KR); Won Kyu Jeung, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 869 days.

(21) Appl. No.: 15/276,055

(22) Filed: Sep. 26, 2016

(65) Prior Publication Data

US 2017/0244381 A1 Aug. 24, 2017

(30) Foreign Application Priority Data

Feb. 18, 2016 (KR) ........................ 10-2016-0018989

(51) Int. Cl.
*H03H 9/19* (2006.01)
*H01L 41/047* (2006.01)
*H01L 41/29* (2013.01)

(52) U.S. Cl.
CPC ............ *H03H 9/19* (2013.01); *H01L 41/047* (2013.01); *H01L 41/29* (2013.01)

(58) Field of Classification Search
CPC .......... H01L 41/047; H01L 41/29; H03H 9/19
USPC ..... 330/144, 278, 286; 331/107 DP, 107 SL, 331/167, 177 V, 36 C, 51, 96; 333/218, 333/219, 187, 193; 310/324, 363, 349, 310/351, 320, 321, 366, 36 OR, 322
See application file for complete search history.

(56) References Cited

U.S. PATENT DOCUMENTS

| 6,060,818 A | * | 5/2000 | Ruby |
| 6,710,681 B2 | * | 3/2004 | Figueredo ............. H03H 9/542 257/531 |
| 7,398,059 B2 | | 7/2008 | Uejima et al. |
| 8,525,620 B2 | | 9/2013 | Stuebing et al. |
| 2003/0009863 A1 | * | 1/2003 | Figueredo ............. H03H 9/542 29/25.35 |
| 2007/0138594 A1 | | 6/2007 | Lee et al. |

FOREIGN PATENT DOCUMENTS

| EP | 1 548 939 A2 | 6/2005 |
| JP | 4309379 B2 | 8/2009 |
| KR | 10-0769875 B1 | 10/2007 |

OTHER PUBLICATIONS

Yang, Ming-Zhi et al., "Manufacture and charcterization of high Q-factor inductors based on CMOS-MEMS techniques." Sensors 11.10 (2011): 998-9806. (9 pages in English).
Chinese Office Action dated Jan. 2, 2020 in corresponding Chinese Patent Application No. 201610916370.9 (14 pages in English; 9 pages in Chinese).

* cited by examiner

*Primary Examiner* — Thomas M Dougherty
*Assistant Examiner* — Karen B Addison
(74) *Attorney, Agent, or Firm* — NSIP Law

(57) ABSTRACT

There are provided an acoustic resonator module, and a method of manufacturing the same. An acoustic resonator module includes a resonating part disposed on a substrate and an inductor electrically connected to the resonating part, and having at least a portion disposed to be spaced apart from the substrate.

13 Claims, 6 Drawing Sheets

ACOUSTIC RESONATOR MODULE AND METHOD OF MANUFACTURING THE SAME

CROSS-REFERENCE TO RELATED APPLICATIONS

This application claims benefit under 35 USC 119(a) of priority to Korean Patent Application No. 10-2016-0018989 filed on Feb. 18, 2016, in the Korean Intellectual Property Office, the entire disclosure of which is incorporated herein by reference for all purposes.

BACKGROUND

1. Field

The present disclosure relates to an acoustic resonator module and a method of manufacturing the same.

2. Description of Related Art

In accordance with the trend for the miniaturization of wireless communications devices, the miniaturization of a radio frequency component technology has been actively undertaken. An example of such miniaturization of the radio frequency component technology is a filter having a form of bulk acoustic wave (BAW) resonator using semiconductor manufacturing technology.

A bulk acoustic wave (BAW) resonator refers to a resonator in which a resonance-causing element includes a thin film of a piezoelectric dielectric material deposited on a semiconductor substrate like a silicon wafer, and using piezoelectric characteristics of the piezoelectric dielectric material is implemented as the filter.

Applications of the bulk acoustic wave (BAW) resonator include, but are not limited to, small and lightweight filters, an oscillator, a resonance element, and an acoustic resonance mass sensor, of mobile communications devices, and chemical and bio devices.

The BAW filter is generally connected to an inductor to improve insertion loss IL and return loss RL within a pass band. However, because the acoustic resonator and the inductor are separately manufactured and then need to be mounted on a substrate, the process for manufacturing such a BAW filter is complex.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, an acoustic resonator module includes a resonating part disposed on a substrate, and an inductor electrically connected to the resonating part, and having at least a portion disposed to be spaced apart from the substrate.

The resonating part may include a first resonating part, and a second resonating part disposed to be spaced apart from the first resonating part.

The inductor may include a spiral part having a spiral shape, and having a first end connected to a lower electrode of the first resonating part, and a lead part connecting a second end of the spiral part to an upper electrode of the second resonating part. The spiral part may include a first material, the first material being the same as that of the lower electrode, and the lead part may include a second material, the second material being the same as that of the upper electrode. The spiral part of the inductor may include molybdenum (Mo), and the lead part of the inductor may include ruthenium (Ru).

The first resonating part, the inductor and the second resonating part may be connected in series.

The first resonating part and the second resonating part may be connected in series, and the inductor may be connected in parallel with the second resonating part.

The substrate may include an air-gap cavity below the inductor and the resonating part. The air-gap cavity disposed below the inductor has an area wider than that of the inductor.

In another general aspect, a method of manufacturing an acoustic resonator module includes forming a lower sacrificial layer on a substrate; forming a resonating part and an inductor by sequentially stacking a first conductive layer, a piezoelectric layer, and a second conductive layer on the lower sacrificial layer; and removing the lower sacrificial layer to form air-gap cavities between the resonating part and the substrate, and the inductor and the substrate.

The forming of the lower sacrificial layer may include forming cavities in a first surface of the substrate; and filling the cavities with material of the lower sacrificial layer.

The forming of the resonating part and the inductor may include forming the first conductive layer; forming a lower electrode and a spiral part by patterning the first conductive layer; forming an upper sacrificial layer embedding the spiral part; stacking the piezoelectric layer on the lower electrode; forming the second conductive layer on the piezoelectric layer and the upper sacrificial layer; and forming an upper electrode and a lead part by patterning the second conductive layer.

The forming of the upper sacrificial layer may include forming a through-hole in the upper sacrificial layer so that an end of the spiral part is exposed, and in the forming of the second conductive layer, the second conductive layer is electrically connected to the spiral part through the through-hole.

The upper sacrificial layer and the lower sacrificial layer may be formed of the same material, and the upper sacrificial layer may be removed together with the lower sacrificial layer in the removing of the lower sacrificial layer.

The method of manufacturing an acoustic resonator module may further include forming a protection layer formed of an insulating material on the upper electrode.

In another general aspect, an acoustic resonator module includes a first resonating part disposed on a substrate; a second resonating part disposed on a substrate, the second resonating part being spaced apart from the first resonating part; and an inductor connected to the first resonating part and the second resonating part, wherein the inductor is suspended above an air-cavity disposed in the substrate.

The first resonating part and the second resonating part may each include a lower electrode, a piezoelectric layer and an upper electrode, the piezoelectric layer being stacked between the lower electrode and the upper electrode.

The inductor may include a spiral part, a first end of the spiral part being connected to a lower electrode of the first resonating part, and a second end of the spiral part being connected to an upper electrode of the second resonating part.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
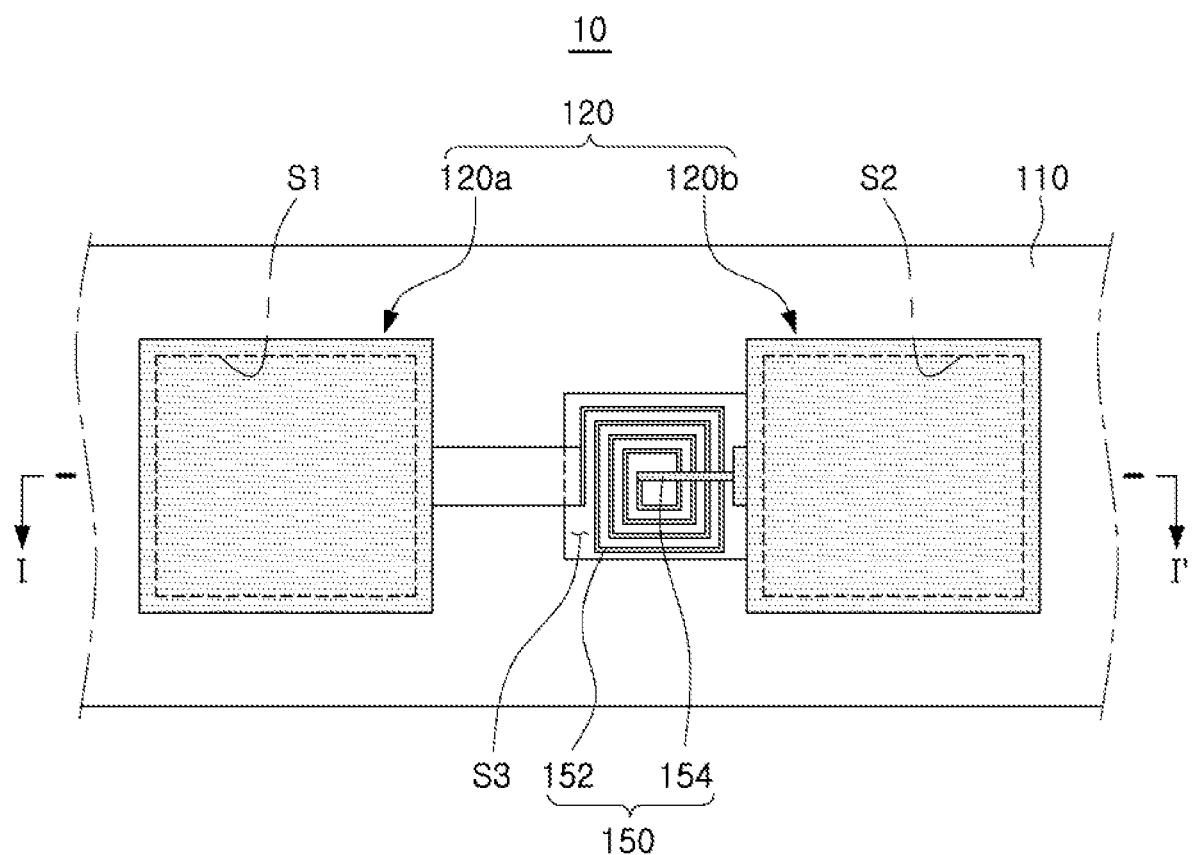
FIG. 1 is a plan view schematically illustrating an example of an acoustic resonator module.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

The contents of the present disclosure described below may have a variety of configurations and propose only a required configuration herein, but are not limited thereto.

Figure 2:
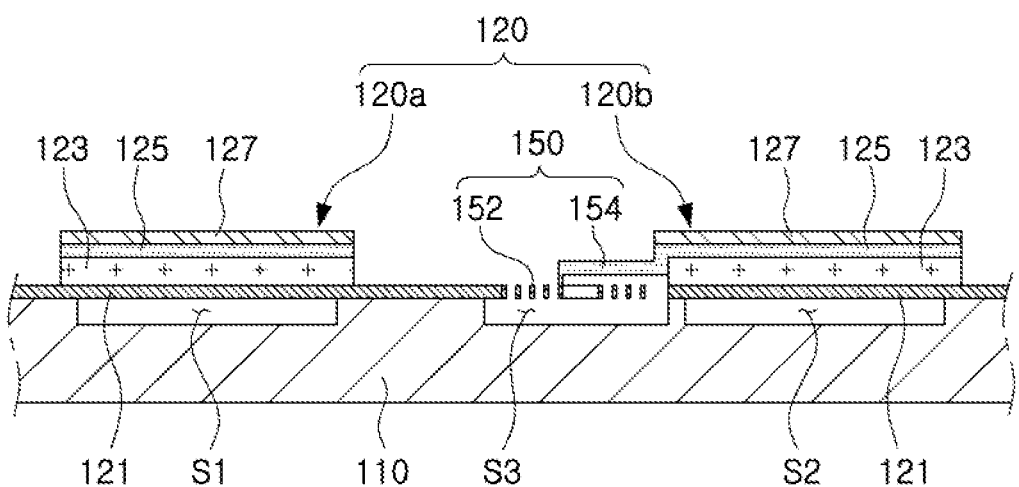
FIG. 2 is a cross-sectional view of an acoustic resonator taken along a line I-I' of FIG. 1.

FIG. 1 is a plan view schematically illustrating an example of an acoustic resonator module and FIG. 2 is a cross-sectional view taken along line I-I' of FIG. 1.

Referring to FIGS. 1 and 2, an acoustic resonator module 10 according to an embodiment includes a substrate 110, a resonating part 120 disposed on the substrate 110, and an inductor 150.

The resonating part 120 further includes a first resonating part 120a and a second resonating part 120b. The inductor 150 is disposed between the first resonating part 120a and the second resonating part 120b.

Air gaps S1 and S2 are formed between the substrate 110 and the resonating part 120. The resonating part 120 is, thus, formed to be spaced apart from the substrate 110 by the air gaps S1 and S2.

The substrate 110 may be a suitable semiconductor substrate such as, for example, a silicon substrate, a silicon on insulator (SOI) type substrate, or a substrate of any other material amenable to semiconductor manufacturing processes.

As used herein, the term "suitable" material refers to a material having physical and chemical properties requisite for part or component for which the material is being used. In addition, the material is compatible to the manufacturing methods being used in making or fabricating the part, component, or the device as a whole. While examples are provided for suitable materials where applicable, the disclosure of this application is not limited to the example materials, and encompasses other suitable materials that will be apparent after an understanding of the disclosure of this application.

The resonating part 120 includes a lower electrode 121, a piezoelectric layer 123, and an upper electrode 125. The resonating part 120 may be formed by sequentially stacking the lower electrode 121, the piezoelectric layer 123, and the upper electrode 125 from below. Thus, the piezoelectric layer 123 may be disposed between the lower electrode 121 and the upper electrode 125.

The resonating part 120 may allow the piezoelectric layer 123 to resonate in response to signals applied to the lower electrode 121 and the upper electrode 125 to generate a resonance frequency and an anti-resonance frequency.

According to an embodiment, the lower electrode 121 may be formed of molybdenum (Mo), and the upper electrode 125 may be formed of ruthenium (Ru). However, the materials of the lower electrode 121 and the upper electrode 125 are not limited thereto. For example, the lower electrode 121 and the upper electrode 125 may be formed of any one of metals such as, for example, gold, molybdenum, ruthenium, aluminum, platinum, titanium, tungsten, palladium, chromium, nickel, or any combination thereof as a main material.

The resonating part 120 may use an acoustic wave of the piezoelectric layer 123. For example, when the signals are applied to the lower electrode 121 and the upper electrode 125, mechanical vibrations may occur in a thickness direction of the piezoelectric layer 123, thereby generating acoustic waves.

The piezoelectric layer 123 may be formed of any suitable piezoelectric material including, but not limited to, zinc oxide (ZnO), aluminum nitride (AlN), quartz, lead zirconate titanate (PZT), barium titanate ($BaTiO_3$), or any combinations or variations thereof.

Resonance occurs when a wavelength of an electrical signal applied across the upper electrode 125 and the lower electrode 121 is twice the thickness of the piezoelectric layer 123. Because electrical impedance changes sharply when resonance occurs, the acoustic resonator may be used as a filter capable of selecting a particular frequency.

In an embodiment, the resonating part 120 may further include a protection layer 127. The protection layer 127 may be formed of a suitable insulating material, and may be formed on the upper electrode 125 to prevent the upper electrode 125 from being exposed to an external environment.

The resonating part 120 may be disposed to be spaced apart from the substrate 110 by the air gaps S1 and S2 in order to improve a quality factor. The first air gap S1 is formed below the first resonating part 120a and the second air gap S2 is formed below the second resonating part 120b.

By forming the air gaps S1 and S2 between the resonating part 120 and the substrate 110, acoustic waves generated from the piezoelectric layer 123 may not be influenced by the substrate 110.

Further, reflective characteristics of acoustic waves generated from the resonating part 120 may be improved by the air gaps S1 and S2. Because the air gaps S1 and S2, which are empty spaces, have impedance approaching infinity, acoustic waves may not be lost by the air gaps S1 and S2 and may remain in the resonating part 120.

Figure 4:
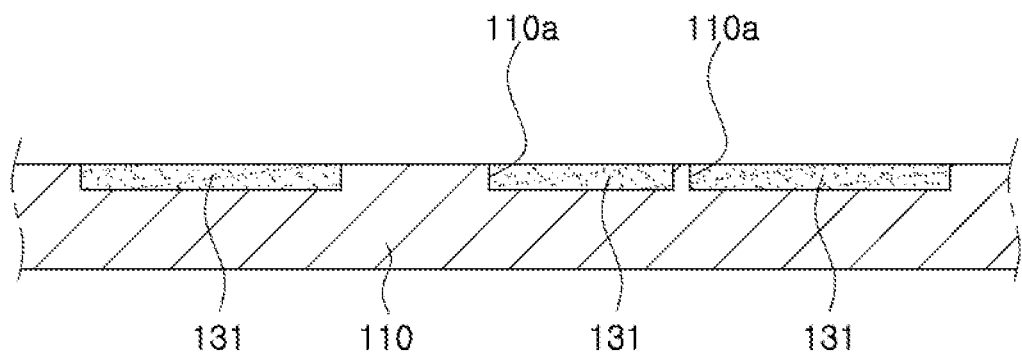
FIGS. 4 through 10 are cross-sectional views illustrating the acoustic resonator module illustrated in FIG. 1 in various stages of manufacturing in accordance with an example of the method of manufacturing an acoustic resonator module.

The air gaps S1 and S2 may be formed in the substrate 110 as a cavity 110a (see FIG. 4). However, the form of the air gaps S1 and S2 is not limited thereto. For example, as long as the resonating part 120 and the substrate 110 are spaced apart from each other, the air gaps S1 and S2 may be formed in any suitable form.

Referring to the figures, first air gap S1 is formed below the first resonating part 120a and second air gap S2 is formed below the second resonating part 120b. In an embodiment, a third air gap S3 may be formed below the inductor 150.

The inductor 150 is formed on the substrate 110, and may be disposed to be spaced apart from a surface of the substrate 110, for example, by the third air gap S3. As a result, the inductor 150 may have a form of a suspended coil inductor.

Thus, in a case in which the inductor 150 is disposed so that it is suspended, because the inductor 150 is disposed in air having dielectric constant of 1, the Q-factor of the inductor 150 may be significantly increased, which may cause the inductor to function as an efficient reactance element.

In some embodiments, the inductor 150 may have a spiral shape. The spiral may include, for example, concentric circles, squares, ellipses, rectangles, triangles, convex regular or irregular polygons, or any other suitable shapes that serve to optimize the electrical, acoustic and geometric (spatial) efficiency of the acoustic resonator module. However, the shape of the inductor according to the present disclosure is not limited to the spiral shape. For example, the inductor 150 may be formed in various shapes such as a meander shape, or a solenoid shape, as needed to improve the electrical, acoustic and geometric efficiency of the acoustic resonator module.

A first end of the inductor 150 is connected to the first resonating part 120a, and a second end of the inductor 150 is connected to the second resonating part 120b. In embodiments where the inductor 150 has a spiral shape, the inductor 150 has a spiral part 152 configuring the spiral shape, and a lead part 154, extending from the center of the spiral part 152, connected to the second resonating part 120b. Further, in such embodiments, the spiral part 152 may be connected to the lower electrode 121 of the first resonating part 120a, and may be formed of the same material as the lower electrode 121. Furthermore, the lead part 154 may be connected to the upper electrode 125 of the second resonating part 120b, and may be formed of the same material as the upper electrode 125.

Accordingly, the inductor 150, in an embodiment, may have the spiral part 152 formed of molybdenum (Mo), and the lead part 154 formed of ruthenium (Ru).

The third air gap S3 allowing the inductor 150 and the substrate 110 to be spaced apart from each other may be formed as a cavity 110a (see FIG. 4) in the substrate 110. Accordingly, the third air gap S3 may be formed to have an area wider than the area spanned by the entire inductor 150, and may be formed to have a depth in which the inductor does not make contact with a bottom surface even when the inductor 150 is vibrating.

According to an embodiment, the inductor 150 may be disposed between the first resonating part 120a and the second resonating part 120b to be connected in series with the first and second resonating parts 120a and 120b. However, the configuration of present disclosure is not limited thereto.

The acoustic resonator module 10 having the configuration as described above has the inductor 150 having constant inductance provided between the resonating parts 120a and 120b. Resonance frequency of the resonator may, therefore, be easily adjusted. As a result, an electro-mechanical coupling constant ($kt^2$) may be varied. Further, because the dielectric constant around the inductor 150 is 1, the Q-factor of the inductor 150 may be significantly increased.

In addition, because the resonating part 120 and the inductor 150 are manufactured as a single module, an electronic device including the resonating part 120 and the inductor 150 may be easily manufactured, and a degree of freedom of a design thereof may be increased.

Meanwhile, the acoustic resonator module according to the present embodiment is not limited to the embodiments described above, and may be variously modified.

Figure 3:
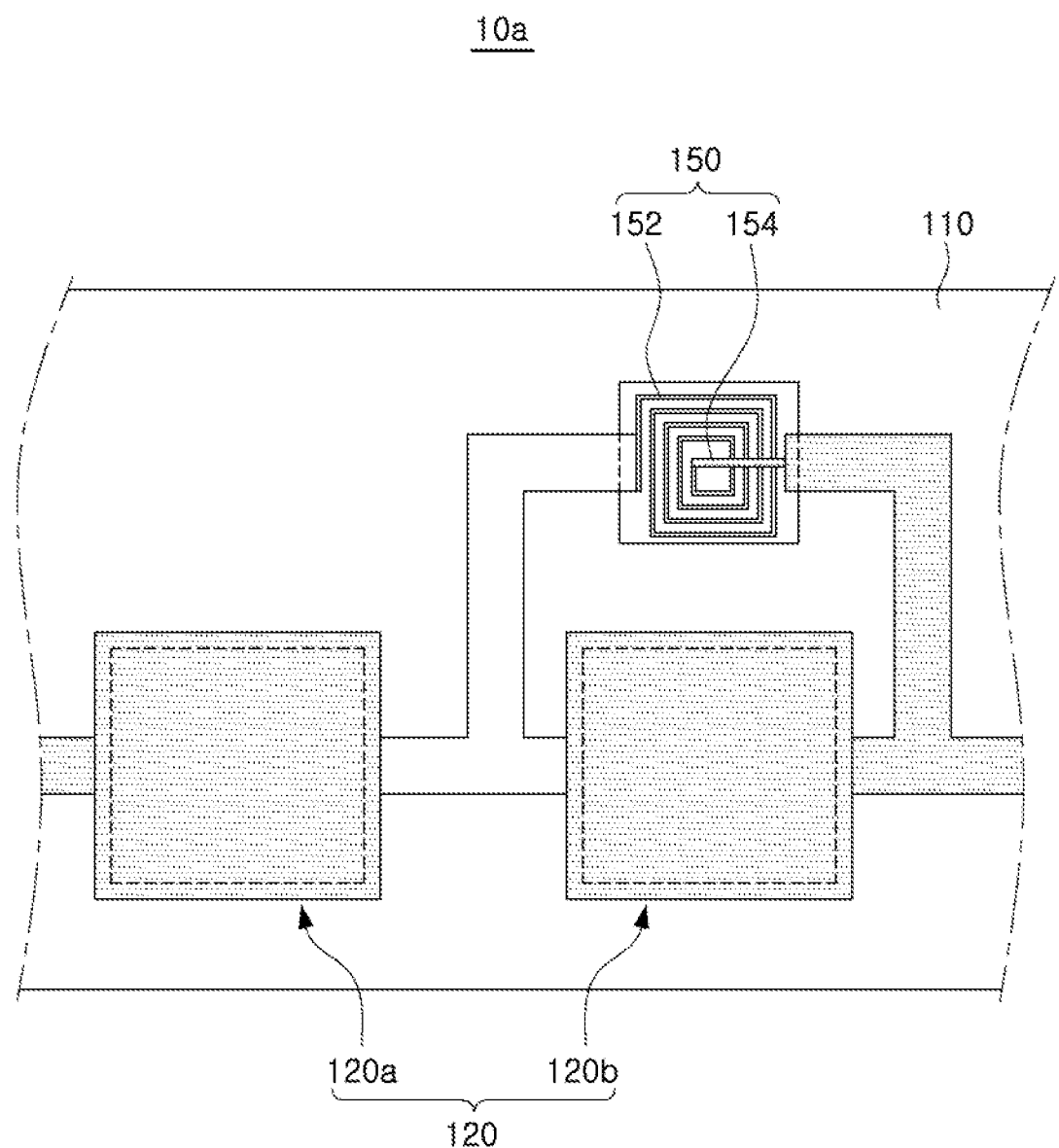
FIG. 3 is a plan view schematically illustrating an example of an acoustic resonator module.

FIG. 3 is a plan view schematically illustrating another example of an acoustic resonator module.

Referring to FIG. 3, an acoustic resonator module 10*a* according an embodiment has the second resonating part 120*b* and the inductor 150 which are connected in parallel to each other. As such, the inductor 150 may be disposed at various positions as needed, and may be connected to the resonating part 120 in various ways.

In addition, while the embodiment described above describe the case in which the acoustic resonator module includes only two resonating parts 120 and one inductor 150, the number of the resonating parts 120 and the inductor 150 may be further added as needed.

Next, a method of manufacturing the acoustic resonator module illustrated in FIG. 1 will be described.

FIGS. 4 through 10 are cross-sectional views illustrating a method of manufacturing the acoustic resonator module illustrated in FIG. 1.

First, referring to FIG. 4, the cavity 110*a* to be used as the air gap may be formed in an upper portion of the substrate 110. The cavity 110*a* may be formed by any suitable process such as, for example, dry or wet etching, laser drilling, or ion milling.

Next, a first sacrificial layer 131 is formed in the cavity 110*a*. The first sacrificial layer 131 may later be removed to form the air gap 130 (FIG. 1). The first sacrificial layer 131 may be formed of a material such as, for example, polysilicon, silicon dioxide, silicon nitride, or a photoresist polymer. The first sacrificial layer 131 may be formed by any suitable process such as, for example, CVD, oxidation, spray pyrolysis, or spin coating. In some embodiments, the process for forming the first sacrificial layer 131 may include more than one step. For example, in an embodiment, a negative photoresist may be spin-coated on the substrate 110 so as to fill the cavity 110*a*, the portion of the photoresist within the cavity 110*a* hardened by exposure to UV light, and the portion of the outside of the cavity 110*a* removed by dissolution in a suitable developer. In such embodiments, the first sacrificial layer 131 may be later removed in due course by a suitable process such as exposure to oxygen plasma. Other suitable processes for forming (as well as eventual removal) of the first sacrificial layer 131 are contemplated, and will be apparent after an understanding of the disclosure of this application.

Figure 5:
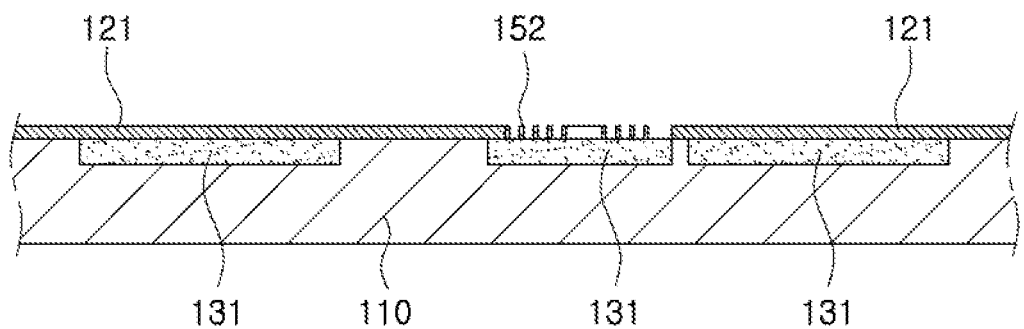

Referring to FIG. 5, the lower electrode 121 of the resonating part and the spiral part 152 of the inductor are, then, formed.

The lower electrode 121 and the spiral part 152 are formed by depositing a first conductive layer on the entirety of top surfaces of the substrate 110 and the first sacrificial layer 131 and then removing (e.g., patterning) unnecessary portions. Forming of the lower electrode 121 and the spiral part 152 may be performed using a photolithography process, but is not limited thereto.

In an embodiment, the first conductive layer may be formed of molybdenum (Mo). However, the material of the first conductive layer is not limited thereto, and the first conductive layer may be formed of various metals such as gold, ruthenium, aluminum, platinum, titanium, tungsten, palladium, chromium, nickel, and the like. Any suitable method including, for example, thermal deposition, physical vapor deposition, pulsed laser deposition, or RF sputtering, may be used for forming the first conductive layer. The choice of the process will depend on the compatibility of the process with other materials and processes being used in forming the other components, parts or layers of the acoustic resonator module as will be apparent after an understanding of the disclosure of this application.

Figure 6:
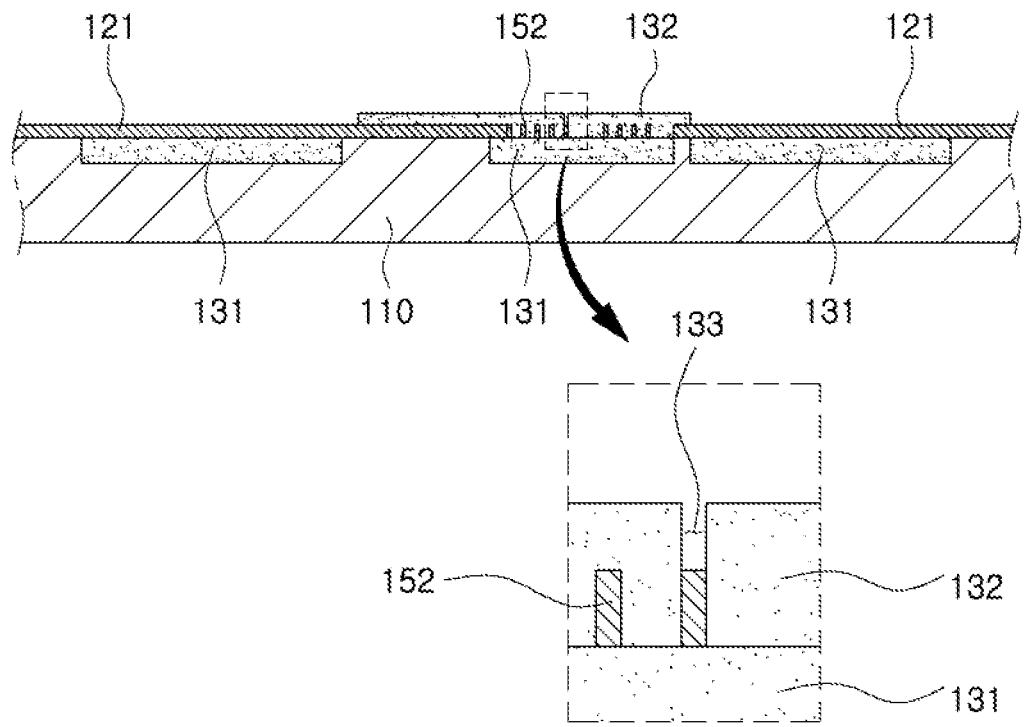

Next, as illustrated in FIG. 6, a second sacrificial layer 132 is formed in the spiral part 152 and on the spiral part 152.

The second sacrificial layer 132 may embed the spiral part 152 and may be formed on the spiral part 152. Further, a through-hole 133 may be formed in the second sacrificial layer 132. As further illustrated in zoomed-in portion of FIG. 6, the through-hole 133 may expose one end of the spiral part 152 disposed at the center of the spiral part 152 to the outside.

The second sacrificial layer 132 may be formed of the same material as the first sacrificial layer 131. Accordingly, in an operation of removing a sacrificial layer to be described below, the first and second sacrificial layers 131 and 132 may be removed together. While in some embodiments, the processes used for forming (as well as removing) of the first sacrificial layer 131 and the second sacrificial layer 132 may be the same, in some other embodiments, the processes may be different depending on the compatibility of the processes with the materials and methods being used for the other components, layers or parts of the acoustic resonator module. The various processes that may be used for forming the first sacrificial layer 131 and the second sacrificial layer 132 will be apparent after an understanding of the disclosure of this application.

Figure 7:
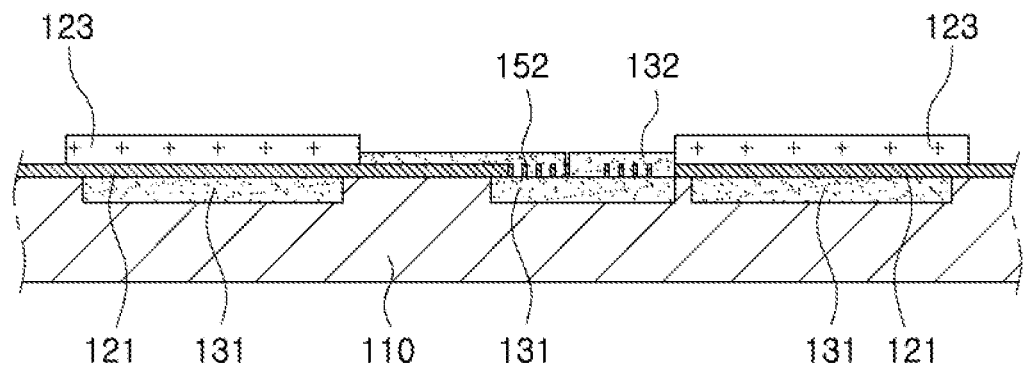

Next, as illustrated in FIG. 7, the piezoelectric layer 123 is formed by depositing a piezoelectric material on the lower electrode 121 and then patterning the piezoelectric material. Any suitable process for depositing the piezoelectric material may be chosen depending on the material being used. For example, a zinc oxide piezoelectric layer may be deposited using any one of the processes including, but not limited to, spray pyrolysis, thermal deposition, sol-gel deposition, spin coating, or RF sputtering.

The piezoelectric layer 123 may be formed of aluminum nitride (AlN). However, the material of the piezoelectric layer 123 is not limited thereto, and the piezoelectric layer 123 may be formed of various piezoelectric materials such as zinc oxide (ZnO), quartz, lead zirconate titanate (PZT), barium titanate ($BaTiO_3$), or any combinations or variations thereof.

Figure 8:
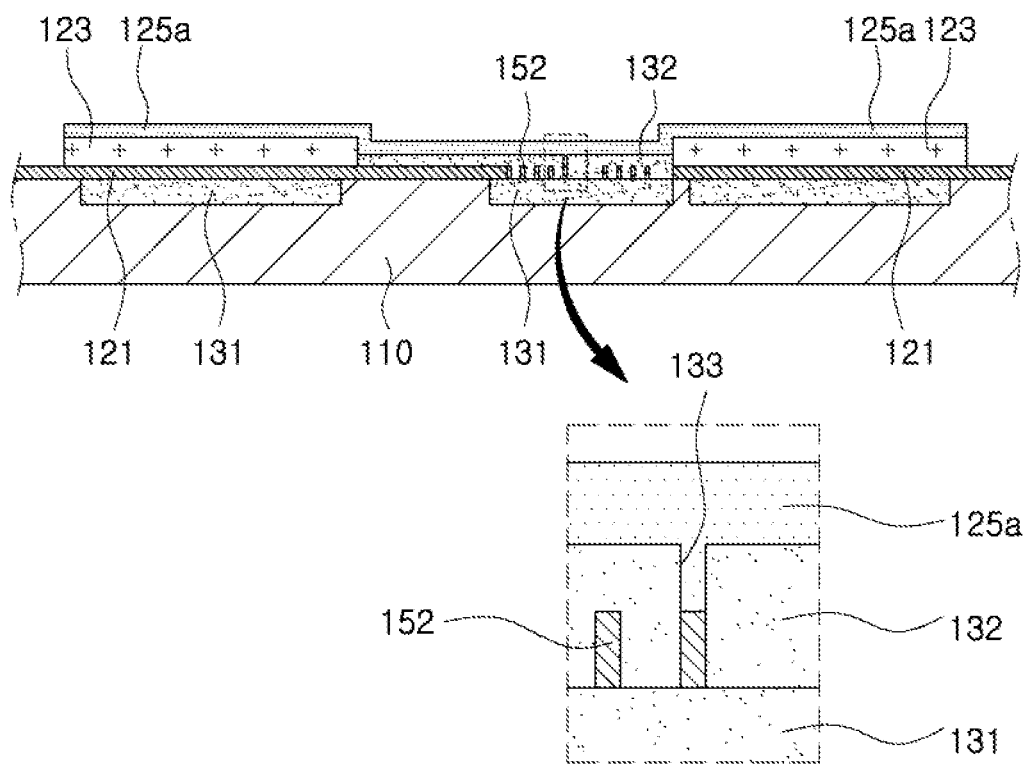

Next, as illustrated in FIG. 8, a second conductive layer 125*a* for forming the upper electrode 125 (FIG. 2) and the lead part 154 (FIG. 2) of the inductor is formed on the piezoelectric layer 123. The conductive layer 125*a* may be deposited on the entirety of a top surface of the piezoelectric layer 123, and the second sacrificial layer 132, as well as in the through-hole 133.

In an embodiment, the second conductive layer 125*a* may be formed of ruthenium (Ru). However, the material of the second conductive layer 125*a* is not limited thereto, and the second conductive layer 125*a* may be formed of various metals such as, for example, gold, molybdenum, aluminum, platinum, titanium, tungsten, palladium, chromium, nickel, or any combinations thereof. As with the first conductive layer, any suitable method including, for example, thermal deposition, physical vapor deposition, pulsed laser deposition, or RF sputtering, may be used for forming the second conductive layer 125*a*.

Figure 9:
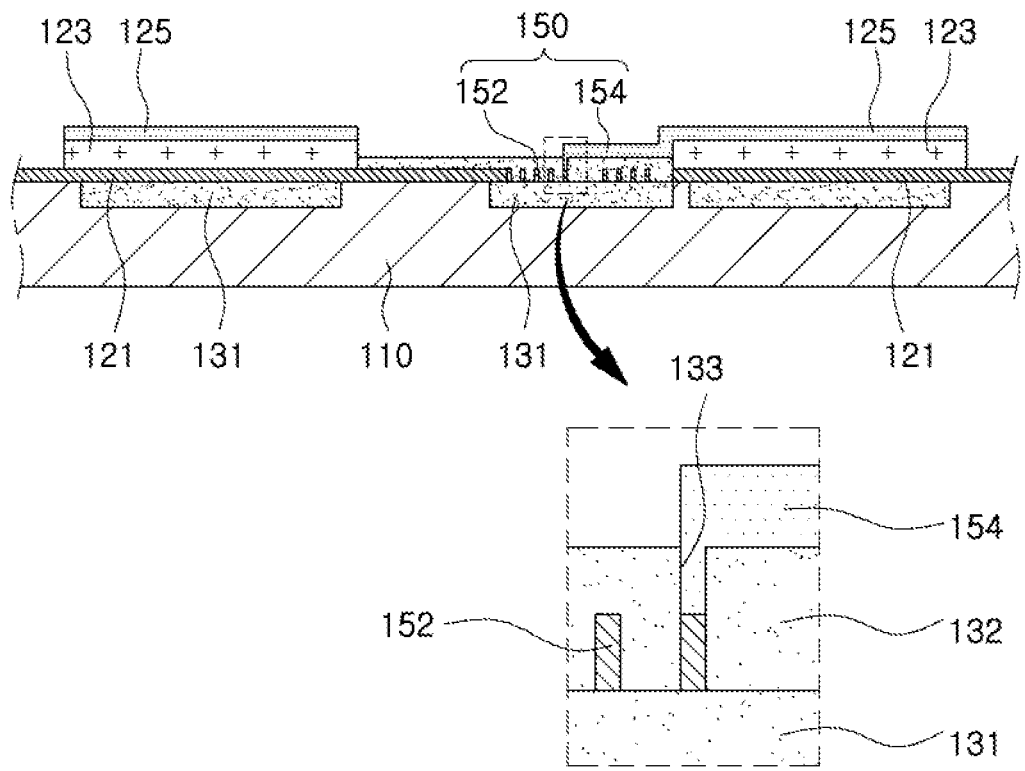

Next, the upper electrode 125 and the lead part 154 of the inductor 150 as illustrated in FIG. 9 are formed by patterning the second conductive layer 125a. An operation of forming the upper electrode 125 and the lead part 154 of the inductor 150 may be performed using a photolithography process, but is not limited thereto.

Figure 10:
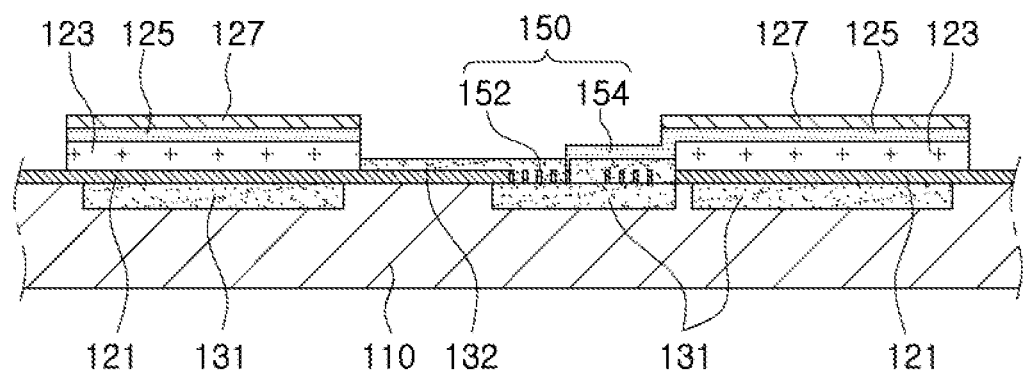

Next, as illustrated in FIG. 10, the protection layer 127 may be formed on the upper electrode 125.

The protection layer 127 may be formed of an insulating material. Here, the insulating material may include a silicon oxide based material, a silicon nitride based material, and an aluminum nitride based material, but is not limited thereto.

Next, the acoustic resonator module 10 according to the present embodiment illustrated in FIGS. 1 and 2 may be completed by removing the first and second sacrificial layers 131 and 132. The first and second sacrificial layers 131 and 132 may be removed by an etching method.

In the method of manufacturing an acoustic resonator module according to the present embodiment having the configurations as described above, since the inductor may be manufactured together in a process of manufacturing the resonator, the acoustic resonator module may be very easily manufactured.

Although specific terminology has been used in this disclosure, for example, resonating part, it will be apparent after an understanding of the disclosure of this application that different terminology may be used to describe the same features, and such different terminology may appear in other applications.

As set forth above, according to the embodiments in the present disclosure, since the acoustic resonator module has the resonator and the inductor which are manufactured as the single module, the electronic device including the resonator and the inductor may be easily manufactured, and the degree of freedom of a design thereof may be increased.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. An acoustic resonator module comprising:
a resonating part disposed on a substrate; and
an inductor connected to the resonating part, at least a portion of the inductor being disposed to be spaced apart from the substrate,
wherein the resonating part comprises a first resonating part and a second resonating part, the second resonating part spaced apart from the first resonating part.

2. The acoustic resonator module of claim 1, wherein the inductor comprises:
a spiral part having a spiral shape, a first end of the spiral part being connected to a lower electrode of the first resonating part; and
a lead part connecting a second end of the spiral part to an upper electrode of the second resonating part.

3. The acoustic resonator module of claim 2, wherein the spiral part comprises a first material, the first material being the same as that of the lower electrode, and
the lead part comprises a second material, the second material being the same as that of the upper electrode.

4. The acoustic resonator module of claim 2, wherein the spiral part of the inductor comprises molybdenum (Mo), and the lead part of the inductor comprises ruthenium (Ru).

5. The acoustic resonator module of claim 1, wherein the first resonating part, the inductor and the second resonating part are connected in series.

6. The acoustic resonator module of claim 1, wherein the first resonating part and the second resonating part are connected in series, and the inductor is connected in parallel with the second resonating part.

7. The acoustic resonator module of claim 1, wherein the substrate comprises an air-gap cavity below the inductor and the resonating part.

8. The acoustic resonator module of claim 7, wherein the air-gap cavity disposed below the inductor has an area wider than that of the inductor.

9. An acoustic resonator module comprising:
a first resonating part disposed on a substrate;
a second resonating part disposed on a substrate, the second resonating part being spaced apart from the first resonating part; and
an inductor connected to the first resonating part and the second resonating part,
wherein the inductor is suspended above an air-cavity disposed in the substrate.

10. The acoustic resonator module of claim 9, wherein the first resonating part and the second resonating part each comprise:
a lower electrode, a piezoelectric layer and an upper electrode, the piezoelectric layer being stacked between the lower electrode and the upper electrode.

11. The acoustic resonator module of claim 10, wherein the inductor comprises a spiral part, a first end of the spiral part being connected to the lower electrode of the first resonating part, and a second end of the spiral part being connected to the upper electrode of the second resonating part.

12. An acoustic resonator module comprising:
a resonating part disposed on a substrate,
wherein the substrate comprises:
an air-gap cavity; and
an inductor connected to the resonating part, at least a portion of the inductor being disposed spaced apart from the substrate and directly on the air-gap cavity.

13. The acoustic resonator module of claim 12, wherein the air-gap cavity has an area wider than that of the inductor.

* * * * *